United States Patent
Tsao et al.

(10) Patent No.: US 6,939,209 B2
(45) Date of Patent: Sep. 6, 2005

(54) METHOD AND APPARATUS FOR GLOBAL DIE THINNING AND POLISHING OF FLIP-CHIP PACKAGED INTEGRATED CIRCUITS

(75) Inventors: Chun-Cheng Tsao, Cupertino, CA (US); John Valliant, Santa Cruz, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/693,310

(22) Filed: Oct. 24, 2003

(65) Prior Publication Data

US 2004/0106358 A1 Jun. 3, 2004

(Under 37 CFR 1.47)

Related U.S. Application Data

(62) Division of application No. 09/924,736, filed on Aug. 7, 2001, now Pat. No. 6,672,947.
(60) Provisional application No. 60/275,670, filed on Mar. 13, 2001.

(51) Int. Cl.[7] .............................................. B24B 1/00
(52) U.S. Cl. ............................. 451/57; 451/5; 451/6; 451/8; 451/9; 451/10; 451/11; 451/41; 451/285; 451/286; 451/287; 451/288; 451/403
(58) Field of Search .............................. 451/5, 6, 8, 9, 451/10, 11, 41, 285, 286, 287, 288, 403

(56) References Cited

U.S. PATENT DOCUMENTS

| | | | | |
|---|---|---|---|---|
| 5,698,474 A | * | 12/1997 | Hurley | 438/15 |
| 5,827,779 A | * | 10/1998 | Masumura et al. | 438/691 |
| 6,252,239 B1 | * | 6/2001 | Goruganthu et al. | 250/559.27 |
| 6,281,027 B1 | * | 8/2001 | Wei et al. | 438/14 |
| 6,448,801 B2 | * | 9/2002 | Dischiano | 324/765 |
| 6,583,873 B1 | * | 6/2003 | Goncharov et al. | 356/326 |

* cited by examiner

*Primary Examiner*—Joseph J. Hail, III
*Assistant Examiner*—Shantese McDonald
(74) *Attorney, Agent, or Firm*—Deborah Wenocur

(57) ABSTRACT

A reliable, inexpensive "back side" thinning process and apparatus therefor, capable of globally thinning an integrated circuit die to a target thickness of 10 microns, and maintaining a yield of at least 80%, for chip repair and/or failure analysis of the packaged die. The flip-chip packaged die is exposed at its backside and mounted on a lapping machine with the backside exposed. The thickness of the die is measured at at least five locations on the die. The lapping machine grinds the exposed surface of the die to a thickness somewhat greater than the target thickness. The exposed surface of the die is polished. The thickness of the die is again measured optically with high accuracy. Based on the thickness data collected, appropriate machine operating parameters for further grinding and polishing of the exposed surface are determined. Further grinding and polishing are performed. These steps are repeated until the target thickness is reached.

27 Claims, 6 Drawing Sheets

METHOD AND APPARATUS FOR GLOBAL DIE THINNING AND POLISHING OF FLIP-CHIP PACKAGED INTEGRATED CIRCUITS

CROSS REFERENCE TO RELATED APPLICATION

This application claims the benefit of Provisional Application No. 60/275,670, filed Mar. 13, 2001.

This application is a divisional of copending U.S. patent application Ser. No. 09/924,736 by Chung-Chen Tsao and John Valliant, filed Aug. 7, 2001, now U.S. Pat. No. 6,672,947 and claims priority thereto. The specification of application Ser. No. 09/924,736 is hereby incorporated by reference in its entirety.

FIELD OF THE INVENTION

This invention relates to integrated circuits (ICs) having flip-chip packaging, and more particularly, to thinning the semiconductor die on which such an integrated circuit is disposed.

BACKGROUND

Demand for flip-chip interconnect technology is increasing, because it offers several advantages relative to traditional wire-bond packaging, including better speed performance, higher pin count, smaller form factor, and better heat management. In wire-bond packaging, the electrical interconnection between the crystalline semiconductor die (synonymously, chip) and the carrier (synonymously, package substrate) is made using conductive wires. As illustrated cross section in FIG. 1, the die 4 is attached to the carrier 6 with the die 4 front-side face up. An exemplary wire 2 is bonded first to the die 4, then looped and bonded to the carrier 6. Wires 2 are typically 1–5 mm in length, and 25–35 microns in diameter. Dies packaged in this manner may be accessed through the front side 7 of die 4 for performing testing and yield analyses. Solder bumps 5 on the underside of the carrier 6 are for external electrical contacts. Mold cap 12 is the top lid of the package.

In contrast, the interconnection between the die 4 and carrier 6 in flip-chip packaging is made through conductive "bumps" (e.g., of solder) 8 that are placed directly on the die surface, as illustrated cross section in FIG. 2. The bumped die is then "flipped over" and placed face down, with the bumps 8 electrically connecting to the carrier 6 directly. The bumps are typically 100–125 microns in diameter.

If the electrical operation of the integrated circuit is to be preserved in its original package, then the only accessible part of the flip-chip packaging for chip repair and/or failure analysis is the "back side" 10 of the die 4, which typically is a relatively thick silicon substrate. The thickness of the silicon substrate of die 4 is typically about 400 to 800 microns.

The increasing use of such flip-chip packaging for integrated circuits, in turn, has driven the development of failure analysis tools that can be applied to the back side 10 of the die. See, e.g., Campbell, Ann N. et al., *"Die Backside FIB Preparation for Identification and Characterization of Metal Voids,"* Proceedings from the 25th International Symposium for Testing and Failure Analysis, pp.317–325, 1999.

In order to access the internal nodes of an integrated circuit device to perform failure diagnostics and/or yield analyses using optical techniques or a charged-particle beam, the thickness of die 4 must be reduced to a workable (penetrable) range, usually 100 microns or less. More sophisticated techniques require an even thinner silicon substrate.

To perform such back side failure analysis or circuit editing using focused ion beam (FIB), a three-step process is currently used. In the first step, a flip-chip packaged die as shown in FIG. 3A in a perspective view is typically mechanically globally thinned (i.e., thinned over its entire surface area) such that the remaining silicon thickness, t, is around 100 microns, as illustrated in FIG. 3A. The pre-thinning thickness is shown by the broken lines. Using existing thinning techniques for this stock removal step, yield drops when the die is thinned to less than 100 microns. (That is, there is excessive breakage of the die 4). As will be understood by those of ordinary skill in the art, FIG. 3A actually depicts a packaged die as in FIG. 2 with solder bumps 5 on its underside serving as the contacts; the back (top) side of the die 4 has been exposed by removing the top of the package. The other detail of FIG. 2 is omitted for simplicity.

After this silicon removal, alignment points 9 (typically three or more) are exposed and identified on the corners of die 4 to assist in navigation of a tool about the die 4, as illustrated in FIG. 3B. This process is referred as "Global alignment". For example, a FIB system commercially available as the "IDS P3X" (Precision Probe Point extension) system, from NPTest, LLC., San Jose, Calif., provides software-based navigation tools in which the CAD layout and live FIB images of the die can be registered to one another. Once registered, these images are linked so that when the user selects a point or feature on one of the images, the corresponding location is identified on the other image. Note that fiducial marks are built into the circuit layer and are not on the surface. Therefore there is a need to expose the marks by removing the silicon above the marks before the alignment processes.

In the second step (FIG. 3C), one or more local "trenches" 13 are defined in the silicon substrate of die 4, with a trench area size between about 100 and 400 microns$^2$. Currently, either laser micro-chemical etching (LMC) or the focused ion beam (FIB) is used to define the trench. While the laser micro-chemical etching method for trenching is fast and reliable, it is also very expensive. Typical systems, which include the laser and sophisticated, but necessary, navigation software, cost around $1.5M. An FIB system, while less expensive ($500K–$1M), is also much slower. Etching a 100 microns$^2$ trench in a die with a FIB device typically takes about 30 minutes.

The distance d from the bottom of the trench 13 to the underlying active circuit layers is only 10 microns at most, as illustrated in FIG. 3D in partial cross section. FIGS. 3D, 3E show only a small part of the die; other illustrated structures are the passivation 19 and metal layers 15a, 15b. Also provided is silicon dioxide deposition layer 21. Moreover, trenching using either LMC or FIB techniques requires an additional thickness measuring tool to monitor the trenching progress. Optical beam induced current (OBIC) and imaging techniques are being used for this purpose. However, either an additional laser system or a high end imaging system is needed to measure silicon thickness inside the trench, further complicating overall requirements for the system.

In the third step (FIG. 3E), an FIB (focused ion beam) system is used to mill to the circuit layer 17 with small openings 23a, 23b to perform a circuit edit through the bottom of the trench 13 formed in the second step. A circuit edit can include shorting circuit elements, cutting a trace (metal layer interconnect), and changing an interconnect 15a, 15b. The FIB system is typically used in conjunction with an etchant gas (for example, XeF2) for milling and quick, uniform removal of the silicon substrate. However, there is an aspect ratio (hole depth vs. hole opening) limitation in the use of an FIB device. Practically, the FIB hole 23a, 23b aspect ratio is less than 10:1 for the backside circuit edit. Therefore, the trench is preferably made as deep as possible within the silicon substrate. For the circuit edit, metal deposition 25 is provided while metal layer 15a is cut.

In accordance with this method, the accuracy of ion beam placement inside the trench to perform a circuit edit is very dependent on stage movement accuracy, after the global registration of the die to the CAD layout. This is due to the fact that the ion beam of the FIB device cannot image through silicon, and optical imaging techniques cannot provide useful data for guiding the ion beam, due to surface roughness inside the trench after LMC is performed or the FIB device is used. In addition, as device (transistor) size shrinks and the die size increases in modern ICs, device navigation and achieving accurate ion beam placement will become more difficult.

Thus, existing processes for preparing a die having flip chip or wire-bond packaging for an FIB circuit edit are time-consuming (especially when trenching is required at several locations in the same die), expensive (because a sophisticated tool is required to make the trenches), and non-ideal for optical imaging (because a trench is too rough to image optically).

The recently developed picosecond imaging circuit analysis (PICA) technique, which measures dynamic photon emission at the transistor level, has also demonstrated utility in device failure analysis. See, e.g., McManus et al., *"Picosecond Imaging Circuit Analysis of the IBM G6 Microprocessor Cache," Proceedings from the 25th International Symposium for Testing and Failure Analysis*, pp. 35–38, 1999. However, effective use of PICA requires the silicon substrate to be thinned to 50 microns or less in order to acquire waveforms having a reasonable signal-to-noise ratio within a reasonable acquisition time. This requirement is due mainly to the fact that silicon absorbs emitted photons efficiently in the visible part of spectrum, leaving near-IR light partially transmitted, and that current photodetectors give a low response in the infrared part of the spectrum. Emission signal intensity increases exponentially as the bulk silicon thickness decreases. While an anti-reflection (A/R) coating on the silicon surface may be used to help improve signal transmission through silicon during PICA analyses, signal acquisition time is still on the order of a few hours at a silicon thickness of 50 microns. To further improve acquisition speed more silicon needs to be removed from the backside.

Thus, a reliable, inexpensive "back side" global die thinning process is needed that is capable of globally thinning a die to a thickness of about 10 microns, without significantly reducing the yield. At a die thickness of 10 microns, the efficiency of PICA for failure analysis can be enhanced, and the ease with which FIB circuit edit/repair is performed can be greatly increased.

SUMMARY

The present invention is directed to a reliable, inexpensive "back side" thinning process and apparatus that is capable of globally (over the entirety of one surface) thinning a die to a predetermined thickness of, e.g., 10 microns, and maintaining a yield of, e.g., 80% or more.

In one embodiment of the method, the packaged die is mounted on a lapping apparatus having a cutting media. The package cap has been removed or cut open. The thickness of the exposed die is measured at at least five locations on the die. The lapping apparatus grinds the exposed backside surface of the die to a thickness somewhat greater than the predetermined (target) thickness. The ground surface of the die is then polished to a mirror finish. The thickness of the die is measured at at least five locations using an optical tool. Based on the measured thickness, appropriate operating parameters for further grinding and polishing of the die exposed backside surface are determined. Further die grinding and polishing are performed by the apparatus according to the determined appropriate operating parameters. These steps are repeated until the target die thickness is reached.

In another embodiment of the method, useful in a die having warpage, additional steps are used. After the die is thinned to a thickness less than 40 microns, the die is heated to a temperature about 60 degrees Celsius. The die is then allowed to cool. This heating/cooling process relieves the stress on the die, reducing warpage. Further grinding and polishing are performed according to the determined appropriate operating parameters. The thickness of the die is again measured at at least five locations using an optical tool. If the warpage is still significant (i.e. greater than 10 um), and if the target thickness has not been reached, the die is again heated, allowed to cool, and further grinding and polishing are performed.

These and other aspects of the present invention may be better understood through the accompanying drawings and the following detailed description of the exemplary embodiments.

DETAILED DESCRIPTION

In accordance with a first embodiment of the present invention, a die of an integrated circuit with flip-chip packaging is thinned to a target thickness of, e.g., 10 microns over its entire backside surface area ("globally"). In other embodiments the thinning need not be global. To reach the target thickness, the thickness of the die is non-destructively measured by a very accurate optical tool at least once during the thinning process. Dies thinned by the present method typically have a yield rate of at least 80%.

Because of the large variations in die thickness (on the order of ±10 microns) in silicon wafers as supplied by wafer manufacturers or otherwise available, the main challenges in thinning a die from such a wafer down to 10 microns or less are controlling the levelness of the surface of the die, and controlling the silicon thickness removed across the surface of the die by the lapping tool. In meeting these challenges, the present method uses a multi-stage process. These stages include: preparation for mounting on the lapping machine and initial height map measurements; bulk silicon removal; collection of die thickness measurements using an optical tool; adjusting the thinning machine operating parameters; second die thinning/polishing stage; and iteration stage. The iteration stage is repeated until the target thickness is reached.

To practice the method successfully, the operator may need to compensate for warping of the die packaging and/or the uneven seating of the die in its packaging during the die thinning process. Techniques for compensating for these factors are also described herein.

In addition, the lapping machine used for thinning the die is calibrated per the operating instructions from its manufacturer. For example, a typical lapping machine of the type commercially available from Allied High Tech. Products, Inc. (Rancho Dominguez, Calif.) requires daily calibration to ensure flatness of thinned and polished surface.

The discussion below first describes a first embodiment of the present invention, which is particularly useful for die where die warpage is insignificant. In this embodiment, the thinning tool used is a lapping machine. Then, a second embodiment of the invention is described, suitable for larger die, e.g. with warpage greater than about 10 microns between center and corner.

1. Global Thinning of Die

Figure 1:
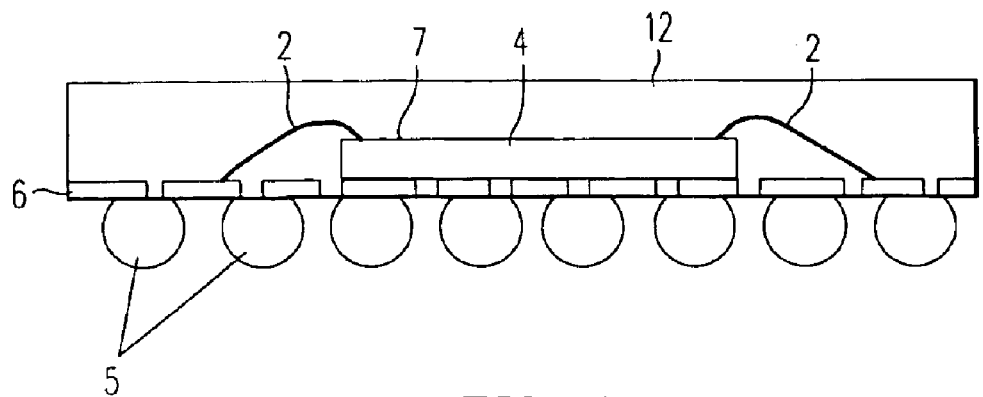
FIG. 1 is a cross-sectional view of an integrated circuit having a die with conventional wire-bond packaging.
Figure 2:
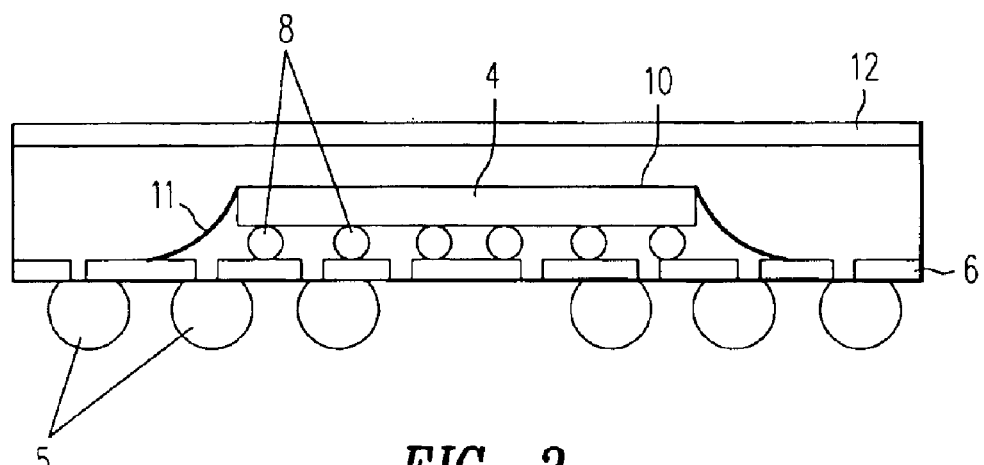
FIG. 2 is a cross-sectional view of an integrated circuit having a die with flip-chip packaging.
Figure 3A:
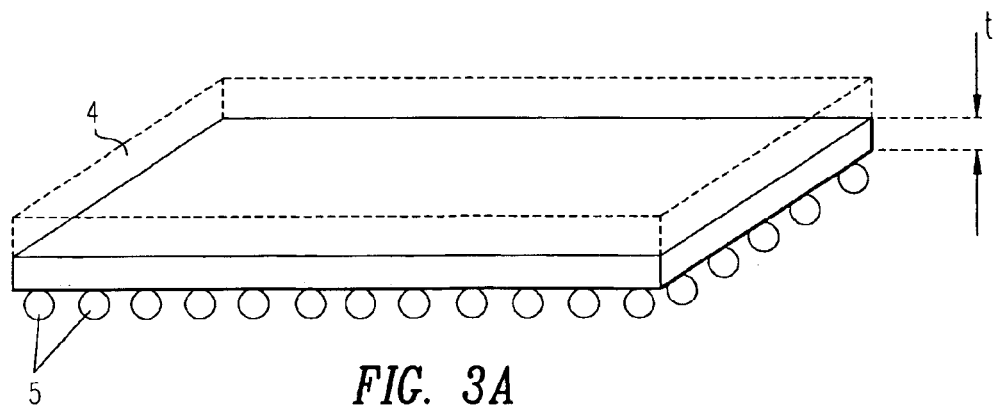
FIG. 3A is a side view of an integrated circuit having a die that has been globally thinned in accordance with the prior art.
Figure 3B:
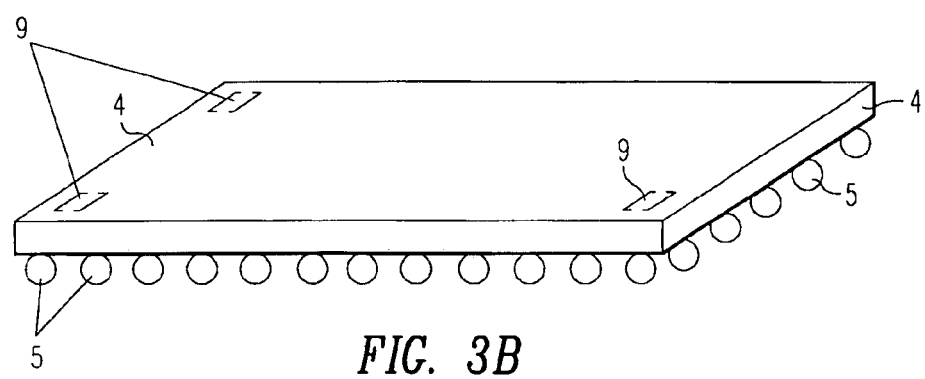
FIG. 3B is a side view of the integrated circuit of FIG. 3A, depicting alignment points on the exposed surface of the die that assist in navigation of a tool about the die.
Figure 3C:
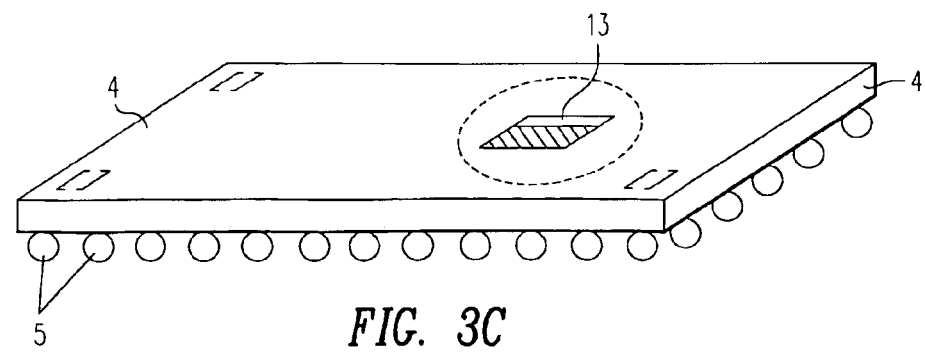
FIG. 3C illustrates a local trench formed in the die of FIG. 3B.
Figure 3D:
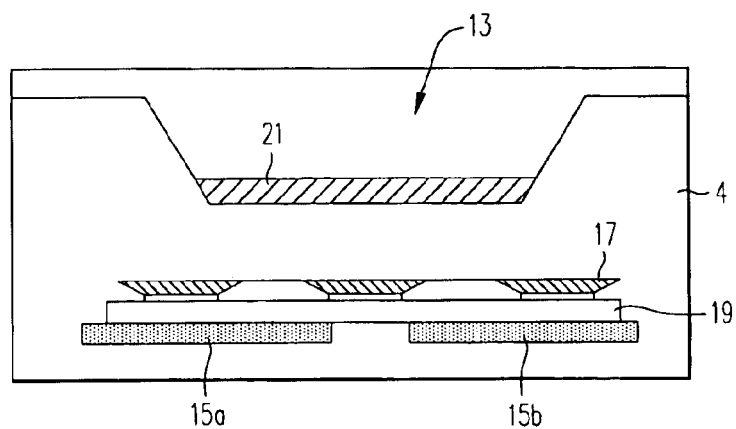
FIG. 3D is an enlarged cross-sectional view of the trench illustrated in FIG. 3C.
Figure 3E:
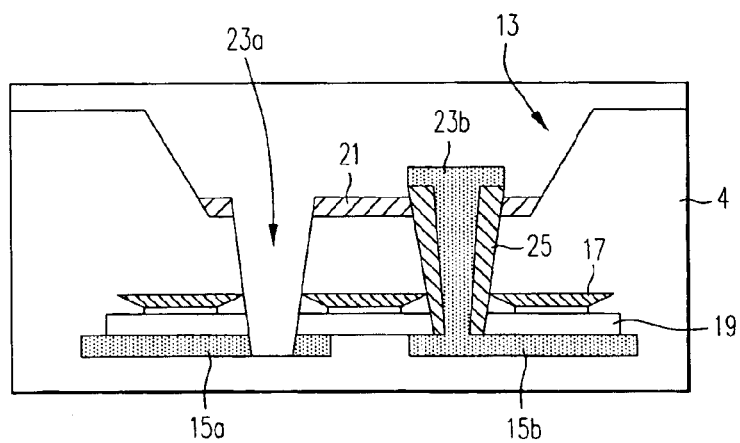
FIG. 3E illustrates FIB editing in the trench shown in FIG. 3D.

Preparation of Die for Mounting on Lapping Machine/Initial Height Map Measurements Often, a die having flip-chip packaging will have a mold cap 12 (synonymously, back lid or heat spreader) above the die 4, as illustrated in cross section FIG. 2. Mold cap 12 is typically used to conduct heat away from the silicon substrate at the back side 10 of the die 4 and is made, for example, of copper.

If mold cap 12 is present, then it is removed so as to minimize warping of the package. Mold cap 12 may be removed manually by using, for example, a razor blade or Exacto® knife together with mild heating on the cap 12 (40°). The back side 10 of die 4 (which is typically comprised of a silicon substrate) is thereby exposed.

After the mold cap (if present) is removed from the chip, the die is mounted to a lapping puck. A lapping puck is a disc with an extremely flat front side and back side, which is ultimately mounted to a lapping machine. Typical dimensions for a lapping puck are a diameter of 50 millimeters and a thickness of 10 millimeters. The lapping puck is preferably made from a substance that is substantially hard and strong (e.g., stainless steel). The chip is mounted to the lapping puck by using, for example, a low temperature wax applied to the heated lapping puck (e.g., melting point 50° C.–80° C.). When the lapping puck is heated by a hotplate to above a melting point of the wax, gently touching a wax stick to the puck will apply a thin layer of melted wax to the puck surface.

After a very thin layer of wax is thereby applied to the front side of the lapping puck, the puck is moved using an insulated tool and is placed front side up in a vessel containing just enough water to cover the depth of the lapping puck. Immediately thereafter, the chip (packaged die) is placed on the melted wax layer applied to the front side of the puck. Using a hollow cylindrical tool having approximately the same cross section area as the package substrate, pressure is manually applied through the tool to the package substrate to evenly position the chip on the puck.

The lapping puck, wax, and water are then allowed to reach thermal equilibrium. As the lapping puck cools, the wax solidifies, thereby anchoring the chip in position on the front side of the lapping puck.

The lapping puck is then removed from the vessel. To obtain approximate initial height map measurements, the starting height of the assembly (lapping puck plus chip package plus die) is measured at at least 5 locations using a micrometer or other tool to an accuracy of ±1 microns. The die height at its center is then referenced as zero. For example, a tabletop micrometer (commercially available from Mitutoyo Corporation, Japan) may be used to measure the height of the assembly at the four corners referenced to center of the die (as determined by visual approximation). This step is to create a baseline on how evenly the chip is seated on the puck, and how much the die is warped.

Following the method described above should result in the four corners of the die being seated evenly relative to the lapping puck. The height measurements collected should not vary by more than 10 microns from one side of the die to the opposite side. If a height gradient between edges greater than 10 microns is present (in which case the die is said to be "wedged"), the chip should be re-blocked immediately.

After collecting the required height measurements, the lapping puck/chip assembly is mounted on a lapping machine. For example, in one embodiment, the lapping machine includes a MultiPrep™ Positioning Device, (commercially available from Allied High Tech Products, Inc. Rancho Dominguez, Calif.). The back side of the lapping puck (the side without the wax) is slid onto an angle adjustment plate at the base of the spindle of the Multi-Prep™ Positioning Device (as described in greater detail below).

For the purposes of this disclosure, "thickness" is defined as the thickness of the die as determined using an optical tool. "Height" refers to the combined heights of the lapping puck, the flip-chip package, and the die thickness, typically measured using a tabletop micrometer or a micrometer mounted on the lapping machine. Height map measurements do not directly indicate die thickness.

First Die Thinning/Polishing Stage

Figure 5:
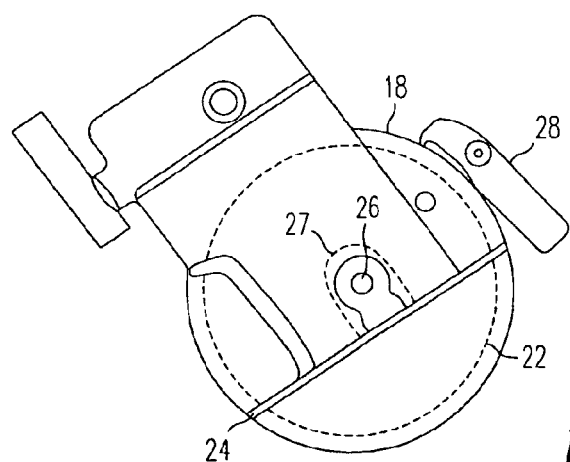
FIG. 5 is a bottom view of an angle adjustment plate of the lapping machine of FIG. 4.
Figure 4:
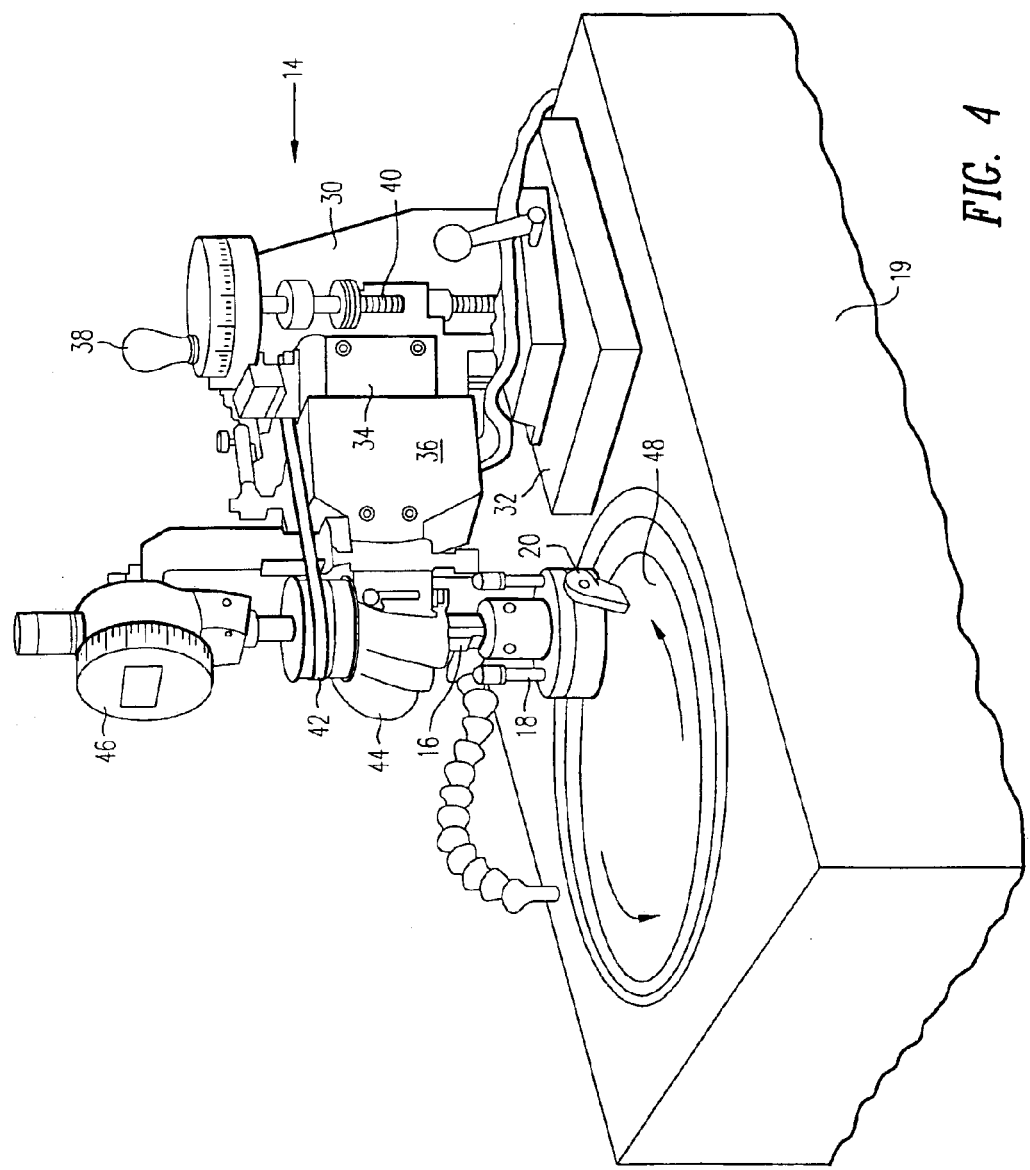
FIG. 4 is a side view of a lapping machine suitable for practicing the present method

Most of the discussion which follows describes the use of a lapping machine 14 as shown in FIGS. 4 and 5 to perform both a first phase of thinning and polishing of the die, and a second phase of thinning and polishing. The lapping machine should be calibrated prior to use each day. A lapping machine that is not properly calibrated will quickly generate a grinding thickness wedge, which makes a target thickness of, e.g., ten microns difficult to achieve.

After a lapping puck having a chip mounted thereto is attached to the spindle 16 by cam-lock lever 28, the puck is indexed downward by counterclockwise rotation of the vertical adjustment knob 38 until the sample makes contact with a rotating platen 48. Lapping machine 14 is calibrated so that puck when mounted on plate 18 is parallel to the plane of platen 48. Platen 48 may have an abrasive material disposed on its surface (e.g., diamond particles resin bonded to a polyester film backing). In the illustrated embodiment, platen 48 is housed in a polishing machine 19. One such polishing machine is the TechPrep™ polishing machine (also commercially available from Allied High Tech Products, Rancho Dominguez, Calif.). By continuing to lower the arm 36, the spindle pulley 42 is displaced farther from the arm 36. The displacement is measured in real time and is displayed on the digital dial indicator 46. This "measured distance" indicates the amount of material that will be removed from the die plus any compression the die makes into the abrasive on platen 48 before the spindle pulley 42 is displaced from the arm 36. As material is being removed, the spindle 16 will travel downward until the spindle pulley 42 makes contact with the arm 36.

In the first die thinning/polishing stage, the die is thinned down to a value somewhat greater than the target thickness and dependent on the expected variation in die thickness. For example, if the die has originally a thickness of approximately 600 microns, with a possible variation of ±12 microns, and the target thickness is 10 microns, then the first thinning/polishing stage must stop when the die has a thickness at or above 22 microns (10 microns+12 microns). To be conservative, it is recommended that the die be thinned to no less than 40 microns in the first die thinning/polishing phase.

Rough grades of cutting media may be used to minimize the time required to thin the die to 40 microns. For example, a 30 micron diamond lapping film, followed by a 15 micron diamond lapping film may be used (Allied High Tech Products Item Nos. 50-30040 and 50- 30045, respectively). These diamond lapping films are precision graded diamond particles, resin bonded to a flat uniform polyester backing. The diamond lapping films are placed on and adhere to the rotating platen. The lapping puck 22, having the die 4 (not shown in FIG. 5) mounted thereto, and itself mounted on the angle adjustment plate 18 of the spindle 16, engages rotating platen 48, thereby "thinning" die 4 (removing silicon from its surface).

The speed with which the silicon is removed from the die depends on several operating parameters, including lapping head pressure, platen rotation speed, and cutting media disposed on the platen. Actual operating parameters and results obtained for thinning die using a MultiPrep™ Positioning Device, in conjunction with a Techprep™ polishing machine (which houses rotating platen 48), are listed in Table A below. These results include die removal for both the first die thinning/polishing stage and a second die thinning/polishing stage (synonymously, fine lapping stage), which is discussed below.

TABLE A

| Step | 1 | 2 | 3 | 4 |
|---|---|---|---|---|
| Abrasive size and material | 3 u diamond film | 15 u diamond film | 6 u diamond suspension | 1 u diamond suspension |
| Allied Item No. | 50-30040 | 50-30045 | 90-30025-S | 90-30015-S |
| Abrasive surface | N/A | N/A | Kempad B | Val-Cloth |
| Allied Item No. | N/A | N/A | 85-150-100 | 90-150-400 |
| Extender | Water | Water | Greenlube ™ | Greenlube ™ |
| Allied Item No. | N/A | N/A | 90-208005 | 90-208005 |
| Platen speed (rpm) | 100 | 100 | 200 | 200 |
| Time (min.) | 10–15 | 10–15 | 10 | 10 |
| Die thickness removed (microns) | Bulk removal | 50 | 5 | none |

In some situations, the IC package also includes a stiffener on top of the silicon substrate. Usually, the stiffener can be removed with the same procedure as removing the cap. In case that stiffener cannot be removed (since package substrate is too thin to stand alone) an aluminum oxide abrasive pad may be positioned on the platen to substitute for diamond films and used for the first part of the first die thinning/polishing stage. Actual operating parameters and results obtained for thinning a die having a copper stiffener using a MultiPrep™ Positioning Device, in conjunction with a TechPrep™ polishing machine, are listed below in Table B.

"Extenders," which are listed in both Table A and Table B, are materials used to enhance the polishing performance of diamond suspensions, compounds, and sprays. They also reduce friction, and increase the life of the polishing cloths.

TABLE B

| Step | 1 | 2 | 3 | 4 | 5 |
|---|---|---|---|---|---|
| Abrasive size and material | 100 u $Al_2O_3$ pad | 40 u $Al_2O_3$ pad | 15 u $Al_2O_3$ pad | 6 u diamond suspension | 1 u diamond suspension |
| Allied Item No. | 50-40070 | 50-40085 | 50-40095 | 90-30025-S | 90-30015-S |
| Abrasive Surface | N/A | N/A | N/A | Kempad B | Vel-Cloth |
| Allied Item No. | N/A | N/A | N/A | 85-150-100 | 90-150-400 |

TABLE B-continued

| Step | 1 | 2 | 3 | 4 | 5 |
|---|---|---|---|---|---|
| Extender | Greenlube ™ | Greenlube ™ | Greenlube ™ | Greenlube ™ | Greenlube ™ |
| Allied Item No. | 90-208005 | 90-208005 | 90-208005 | 90-208005 | 90-208005 |
| Platen speed (rpm) | 75–100 | 100–125 | 100–150 | 200 | 200 |
| Time (rpm) | 30–40 | 5–10 | 5–10 | 10 | 10 |
| Die thickness removed (microns) | Bulk removal | 80 | 30 | 5 | none |

The thinning progress can be monitored mechanically using a micrometer. A built-in digital dial indicator 46 (e.g., a Mitutoyo micrometer) can determine how much material is removed in real time, but with more fluctuation because of the lapping motion. The tabletop micrometer that is used for initial height measurements can provide more accurate thinning update with ±1 um accuracy.

While the methods just described may be satisfactory for die thinning to a thickness of 50 microns or more, they are not satisfactory for thinning the die to less than 20 microns. Applicants have found that the use of the digital micrometer often shows less or more final silicon thickness than the actual thickness because of the silicon thickness variation of the raw wafer and the nature of mechanical "height" measurement. Accordingly, the thickness of the die should be measured directly after the die thickness is below 50 microns. An optical approach is described below.

After the first phase of die thinning is completed, the surface of the die is polished to a mirror finish so that an optical tool may be used for die thickness measurements. This may be accomplished, for example, as described in step 3 and 4 in Table A. A mirror polish will be produced on a cleanly ground die surface after polishing. After the mirror polish is obtained, die thickness measurements are obtained using an optical tool, as explained below.

Obtain Die Thickness Measurements Using Optical Tool

After the die has been thinned to the upper limit of the target thickness {or, conservatively, 40 microns), and a mirror polish is present on the surface of the die. thickness measurements is preferably obtained at a minimum of five points on the die {e.g., four corners and the center of the die) using an optical tool. The optical tool is, for example, a reflectance spectrometer, a confocal microscope, or an ellipsometer. Advantageously, these optical techniques for measuring thin films are very accurate, non-destructive, and require little or no sample preparation. The die thickness measurements should be collected from approximately the same points where they were collected when the table top micrometer was used for the initial height map measurements, discussed above. Preferably, a fixture is fabricated that permits mounting of the lapping puck and die on or just above the viewing stage of the selected optical tool, so that the die need not be removed from the lapping puck to perform die thickness measurements.

Figure 6:
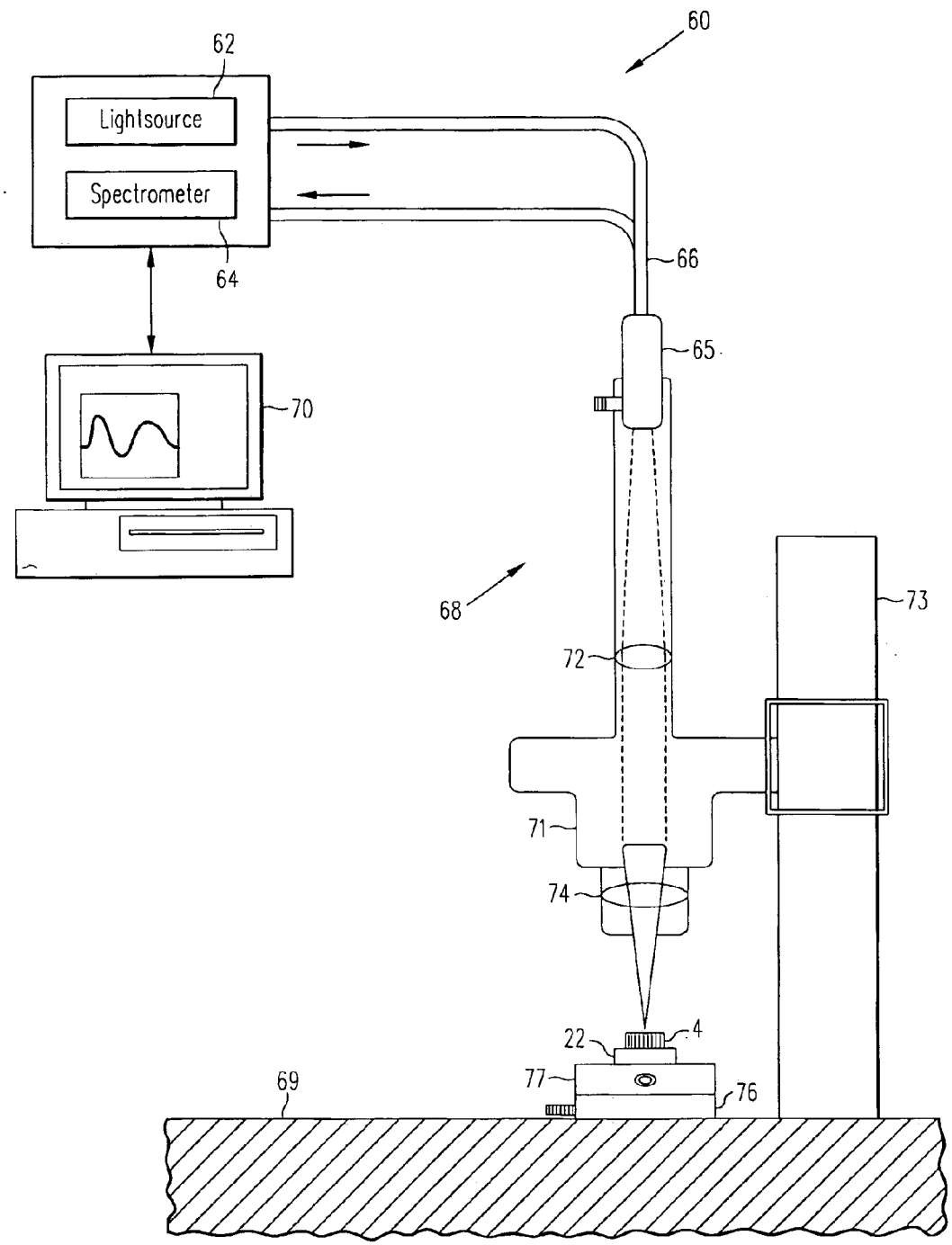
FIG. 6 is a schematic illustration of a system including an optical tool for measuring silicon thickness in accordance with the present method.

In one embodiment, the optical tool used to obtain die thickness measurements is a reflectance spectrometer. Spectral reflectance is an expression of the amount of light reflected from a thin film and the substrate underneath over a range of wavelengths, with the incident light perpendicular to the sample surface. As illustrated in FIG. 6, a system 60 for measuring the thickness of a die 4 includes a light source 62 and a spectrometer 64, in communication with a computer 70.

As better appreciated by reference to FIG. 6, light of various wavelengths is propagated through a fiber optic cable 66 to a lens assembly 68, and from lens assembly 68 to the die 4. Some of the light provided by the light source 62 is transmitted into die 4, and some is reflected, depending on {among other factors), the thickness of die 4. Reflected light travels back through the fiber optic cable 66 and into the spectrometer 64. Spectrometer 64 measures the intensity of the reflected light as a function of the wavelength of the incident light. This information is transmitted from spectrometer 64 to computer 70, which calculates the thickness of die 4 at a given point on die 4.

Advantageously, the reflectance spectrometer is relatively inexpensive, fast, and very accurate. For example, the Model F20 reflectance spectrometer {commercially available from Filmetrics, Inc., San Diego, Calif.) currently costs about $12,000, and is capable of making about one thickness measurement per 30 seconds including stage navigation. The spectrometer for the Model F20 is a fixed Czerny-Turner spectrometer with a 512-element photodiode array. The light source is a regulated tungsten halogen light source.

In an embodiment of the apparatus for the present invention, the spectrometer is modified such that it operates in the near IR wavelength range, 700 nm to 1,000 nm, rather than the standard 400 nm to 700 nm range. This range of wavelengths is particularly useful because transmission of light through silicon is much higher in this near-infrared range. In addition, the lens system of the spectrometer was also modified by Applicants, because the beam spot size provided by the F20 is greater than 500 microns, which is too large for this application. As illustrated in FIG. 6, lens assembly 68 was modified to include a lens 72 having a focal length of 40 mm, which acts as a condenser to collimate the light beams exiting from fiber head 65 of fiber optic cable 66, and a 20× near-IR microscope objective lens assembly 74 (Mitutoyo model M plan) to focus the beam on die 4. Objective lens assembly 74 includes a lens with a custom coating, needed for working in the near-IR range. To properly position die 4 with respect to objective lens 74, a z stage focus adjustment 71 is provided, which is mounted to a post 73. Post 73, x stage 76 and y stage 77 are positioned on, for example, a bench breadboard 69, to minimize vibration while measuring die thickness. An x stage 76 and y stage 77 are also provided for positioning die 4. Advantageously, as a result of these modifications, a beam spot size on the order of 100 microns is provided, and dies having a thickness of up to 50 microns may be measured with an accuracy of ±0.1 microns. The cost of these modifications is relatively low.

In another embodiment, the optical tool used to obtain die thickness measurements is a confocal laser scanning microscope (CLSM). In a traditional microscope, the depth of focus is on the order of ten microns. Consequently, when a sample is viewed through a traditional microscope, the image viewed is a composite of 10 microns thick of the sample. In contrast, the depth of focus on a CLSM is very shallow, on the order of one micron, providing well-defined focused layer of the sample.

One such CLSM, the InfraScan 200 commercially available from Checkpoint Technology, San Jose, Calif.) may be used in conjunction with a high precision z stage on which the sample is mounted. The elevation of the z stage may be adjusted at 0.1 micron increments. To determine the thickness of the die, the z stage is first moved to focus the CLSM on the top surface of the die (the appearance of scratches or coating residue on the top surface of the die can be used to help determine the best image). When the best image is obtained of the top surface of the die, the associated z stage encoder value is recorded. Keeping the same x and y coordinates, the z stage is then moved up, to focus on the die diffusion layer. The z stage encoder value associated with this position is then recorded. The difference between the two z stage encoder value is the distance the z stage has traveled. The thickness of the silicon is then calculated by multiplying the actual z stage travel distance by the refractive index of silicon, which range 3.5 and 3.7 depending on the substrate type and doping level.

While the CLSM can measure silicon thicknesses up to a few hundreds of microns, the CLSM is significantly more expensive than the reflectance spectrometer—costing approximately $100,000 per unit. CLSM accuracy (about 1 micron, limited by depth-of-focus) is not as good as that of the reflectance spectrometer (0.1 micron) because of the finite depth-of-focus, CLSM gives poorer accuracy when measuring very thin sample, say less than 10 microns. Moreover, a skilled operator requires a few minutes to complete a single thickness measurement using a CLSM.

In another embodiment, the optical tool used to obtain die thickness measurements is an ellipsometer, another known tool for thin film measurement. Although an ellipsometer is the most accurate measurement tool for film thickness, the extra accuracy is not needed here, and it commands a higher price. Moreover, a higher degree of operator knowledge is needed to operate the ellipsometer than is required with either the reflectance spectrometer or CLSM.

Adjust Lapping Machine Operating Parameters

Based on the die thickness measurements obtained using an optical tool (as described above), the lapping machine operating parameters may need to be adjusted conventionally prior to beginning the second phase of thinning and polishing of the die. Parts of the lapping machine may require calibration and/or adjustment if the measurements obtained indicate wedging, as defined above. A die is said to be wedged when the die shows an uneven thickness map as determined the optical measurement mentioned above.

A wedged die may be caused by a lapping head that is not properly calibrated, or by an unevenly "blocked" die. Lapping head calibration should be checked before an attempt is made to re-block the die onto the lapping puck. If the lapping head is found to be properly calibrated, then to achieve an even layer of silicon at the target thickness, the chip must be re-blocked in a manner that physically raises only the low corners. The high and low corners of the die should be referenced first, and then the chip may be removed from the lapping puck.

Methods for Re-blocking Die Onto Lapping Puck

A properly positioned shim (e.g., a Kimwipe® tissue) or multiple shims can raise the low corner(s) of a die by an amount ranging from 10 to 30 microns. The shim is positioned between the bottom of a low corner of the chip and the top surface of the puck (which has the wax applied to it). The lapping puck, having the chip and shim(s) mounted thereto, is again positioned on the lapping machine, which engages the rotating platen. High corners are then removed. However, this method is only effective in correcting for corners that are between 10 microns or more too high.

Another method that is more universal may be used for correcting for high corners (i.e., will level a die having corners that are less than 10 microns too high). In this method, one of two micrometers on the spindle hub of the lapping tool is adjusted so that the lapping puck (attached to the spindle hub) and the rotating platen are not parallel. Thus, when the spindle hub is rotating, it engages the rotating platen unevenly, such that a high corner of the die is machined, while the low corners are not. The amount that the micrometers are adjusted is determined by trial and error.

Second Die Thinning/Polishing Stage

In the second die thinning/polishing stage, the lapping machine is used to continue to thin the die from its thickness as determined by the optical tool to the target thickness (e.g., 10 microns) using adjusted operating parameters, if appropriate. From this point, the die thinning should proceed cautiously.

During the second die thinning/polishing stage, the chip should be visually inspected and/or optically measured more frequently to ensure that die thinning progress is in control. Moreover, great care needs to be taken to ensure that foreign debris does not fall into the lapping medium (e.g., diamond film) from the package or the chip copper stiffener. Such foreign debris may cause damage ranging from minor surface scratches (which may be polished away using a Vel-Cloth pad and a 1 micron diamond suspension) to complete destruction of the die when the die is extremely thin, e.g., less than 20 microns. Sometimes, scratching may be caused by the lapping medium itself, indicating the lapping medium may need to be changed.

For the second die thinning/polishing stage, a 9 micron diamond film can be used to bring the thickness from 40 microns to 20 microns and then a three micron particle diamond lapping film may be used to remove material (silicon) from the die at a rate of approximately one micron per minute, assuming a virgin diamond film, and a platen rotational velocity of 150 rpm. Prior to each subsequent thickness measurement with the optical tool, the die is polished to a mirror finish.

Iteration State

During this stage, the steps of die thickness measurement using an optical tool, adjusting lapping machine operating parameters, and second stage die thinning and polishing are repeated until the target thickness (e.g., 10 microns) is reached.

2. Global Thinning of Highly Warped Die

Referring again to FIG. 2, in flip-chip packaging, the interconnection between die 4 and package substrate 6 (synonymously, "carrier") is made through a conductive "bump" 8 that is placed directly on the front side of die 4. Conductive bumps 8 are attached to package substrate 6 using a solder reflow process. After die 4 is soldered to the package substrate 6 through bumps 8, underfill 11 (an epoxy) is added between die 4 and substrate 6, surrounding the space between bumps 8. Underfill 11 is added to absorb stress exerted on conductive bumps 8 resulting from the different rates of thermal expansion at which die 4 and substrate 6 contract while cooling after solder reflow. Underfill redistributes stress over the entire surface area of die 4, and reduces the stress on solder bumps 8.

Figure 7A:
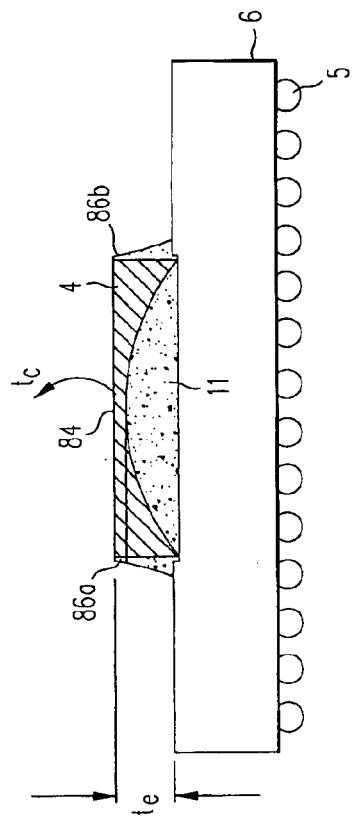
FIG. 7A is an enlarged side view of a large die mounted on a substrate, as it appears after solder reflow and the addition of underfill between the die and the substrate.

Nevertheless, in die with larger surface areas (e.g., greater than 2 $cm^2$), we have observed that die 4 itself tends to "bow" upward after underfill has cured, taking on a convex shape, as illustrated (highly exaggerated) in FIG. 7A. (For clarity, solder bumps 8 are omitted from FIGS. 7A–7D). As a result, after bulk silicon removal is achieved by the first die thinning/polishing stage, which also planarizes the top surface 90 of die 4, the thickness of die 4 at corners 86a, 86b ($t_c$) is significantly greater than at center 84 of die 4 ($t_c$), as illustrated in FIG. 7B.

Figure 7B:
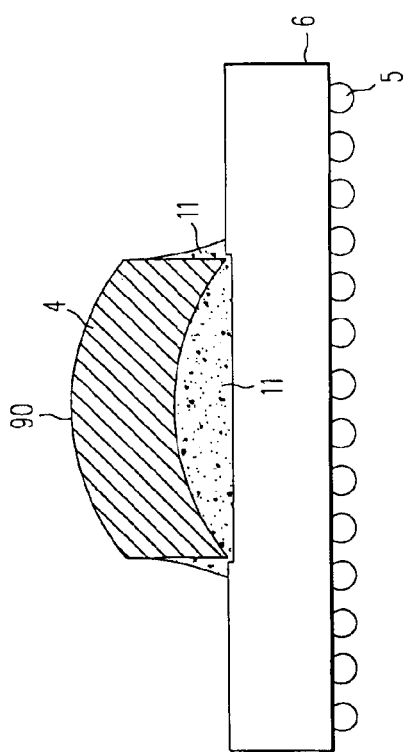
FIG. 7B is a side view of the die of FIG. 7A, following a first phase of die thinning and polishing.

Often, there is a thickness difference of 30 microns or more between the center 84 and corners of die 4, two corners of which are shown as 86a and 86b in FIG. 7B (the remaining two corners are hidden in this view). The thickness difference is much greater than that associated with smaller die (e.g., 10 micron thickness difference in die having a surface area of 1 cm² or less). Obviously, when a target thickness of 10 microns ±2 microns is required for the entire surface of die 4, a thickness difference of 30 microns or more between that at center 84 of die 4 and corners 86a, 86b, is unacceptable. Applicants have found that this thickness difference can be partially corrected by taking additional steps in treating the die.

Figure 7C:
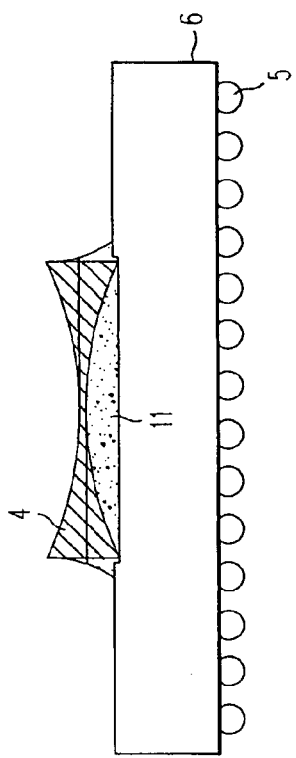
FIG. 7C is a side view of the die of FIG. 7B, after the die has been heated and then allowed to cool, in accordance with an embodiment of the present method.

Specifically, Applicants have found that when die is 40 micron or less thick, by heating die 4 to a temperature between 40° C. and 60° C. (by, for example, placing the lapping puck and die on a heating plate, as described earlier), and then allowing die 4 to cool to room temperature, the height profile of die 4 changes, such that the heights at the corners 86a, 86b ($h_c$) of die 4 are increased slightly, so that the overall die height profile has changed from convex to concave, as illustrated in FIG. 7C. Repeated experimentation with multiple similar-size die has shown that the corners of die 4 "grow" 10 microns to 15 microns in height as a result of the heating and subsequent cooling of the die as just described.

Figure 7D:
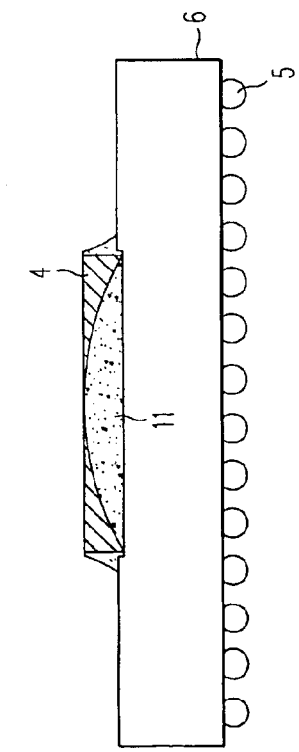
FIG. 7D is a side view of the die of FIG. 7C, after the die has been treated by a second phase of die thinning and polishing.

A second die thinning/polishing step is then performed, wherein die 4 is further planarized, so that the height at the corners of the die is reduced (relative to the center of the die), as shown in FIG. 7D. That is, the corners of the die "grown" in the previous step are removed, and die 4 is closer to its target thickness across its entire surface.

A second heating/cooling process may "grow" an additional zero to 15 microns on the corners depending on the packaging material or process. By performing a final fine lapping step, the additional height at the corners is again removed, and die 4 is globally thinned to a target thickness of 10 microns ±2 microns (as determined by again measuring with the optical tool).

In the case that die warpage cannot be overcome completely, particularly at the corner section of the die, a manual, local thinning may be used as a final resort. Diamond pastes of various roughness levels are applied locally to the thick silicon area that needs to be thinned. Suitable diamond pastes are 6 micron or 15 micron mono crystalline diamond compounds, e.g. Item nos. 9-21092 and 90-21085 supplied by Allied High Tech. Products. A Q-tip or other thin stick wrapped with soft cloth is used by operator with diamond paste to remove the silicon locally. Since this is only used to correct the thickness variation of a few microns on a small area, the process is fairly quick. Thickness is measured from time to time using an optical tool to monitor the local thinning progress.

3. Cleaning and Functional Testing of Die After Thinning

After the target thickness for the die has been reached, the chip is removed from the puck by melting the wax using the heat plate. All wax should be removed from the chip, because the wax will act as an electrical insulator, which could lead to false indications of device failure during later functional testing. The wax can be cleaned out by immersing the chip into a vessel containing acetone or citric-acid base solvent. The chip is then finally rinsed with acetone.

After the chip has been cleaned and allowed to cool to room temperature, an electrical functional test is recommended before the chip is further tested. The functional test will ensure that the global die thinning process has not affected performance and/or functional characteristics of the chip. Functional testing performed on die globally thinned according to the present method, and having a thickness of 10±2 microns, has proven a yield rate of 80% or more.

A heat sink may be required on top of the thinned die if the chip generates more power than the thinned silicon can dissipate during a functional test. The heat sink may take many forms, ranging from a solid heat spreader to a viscous thermal grease, so long as it is electrically insulating. However, if optical probing is performed (e.g., PICA), then the heat sink material must be optically transparent and its surface highly polished so that it does not absorb or scatter light. With sufficient heat dissipation capability, the thinned die will then be able to be tested at its normal operating speed for full characterization.

Thus, the present method and apparatus provides an ultra-thin, highly flat, functioning integrated circuit die having an optical finish on its entire exposed surface. The method itself is controllable, predictable, and uses simple, relatively inexpensive laboratory tools. Moreover, the ultra-thin die can be produced within a reasonably short time, as compared with methods currently used for local die thinning, the trench approach. Expensive, time-consuming trenching within the die is avoided altogether. Furthermore, an optical finish may be provided on the exposed die surface. When an anti-reflective coating is applied to the exposed die surface, much better image quality and light transmission is achieved when using emission techniques such as PICA.

The presently disclosed embodiments of the inventions are illustrative and not limiting. Moreover, the method of the present invention is not limited to specific IC package materials or components. Modifications and substitutions for the steps of the method disclosed will be apparent to one skilled in the art in light of this disclosure and are intended to fall within the scope of the appended claims.

We claim:

1. An apparatus for measurement of remaining semiconductor substrate thickness of at least a portion of a semiconductor wafer, said portion having a thickness less than 50 micrometers, said measurement having an accuracy at least as good as about 100 nm, said apparatus comprising:

a holder for holding said wafer portion;

a light source of broadband emission including wavelengths from visible to IR spectrum, a spectrometer configured to operate at light wavelengths in the range between 700 nm and 1000 nm;

a lens assembly to collimate light from said light source into a collimated light beam;

a microscope objective lens assembly positioned to focus said collimated light beam onto said wafer portion as incident light at a point of incidence, a portion of said incident light being reflected from said wafer portion, said incident light having a beam spot size at said point of incidence, said microscope objective lens assembly configured to operate in Near InfraRed (NIR) range;

means for delivering said light from said light source to said lens assembly to be collimated into said collimated light beam;

means for delivering reflected light from said wafer portion to said spectrometer;

said lens assembly and said microscope lens assembly configured to provide said beam spot size with a diameter less than 100 microns;

an xyz stage assembly, said xyz stage assembly adjustable to provide relative motion between said wafer portion and said microscope lens assembly, to move said point of incidence across said wafer portion, to provide focus adjustment for said objective lens assembly and to provide device navigation; and a computer in communication with said reflectance spectrometer for calculating the remaining thickness of said wafer portion.

2. The apparatus of claim 1, wherein said semiconductor substrate is a silicon substrate and said semiconductor wafer is a silicon wafer.

3. The apparatus of claim 1, wherein said light source of broad band emission is a regulated tungsten halogen light source.

4. The apparatus of claim 1, wherein said lens assembly comprises a condenser lens assembly.

5. The apparatus of claim 1, wherein said means for delivering said light from said light source to said lens assembly is a fiber optic cable coupled to said light source.

6. The apparatus of claim 1, wherein said means for delivering reflected light from said wafer portion to said spectrometer is a fiber optic cable.

7. The apparatus of claim 1, wherein said xyz stage assembly is configured to have said wafer portion mounted thereon.

8. The apparatus of claim 1, wherein said xyz stage assembly has a resolution at least as accurate as 0.1 micron.

9. A method of measuring the remaining substrate thickness of at least a portion of a semiconductor wafer comprising the steps of:

mounting said wafer portion on the holder of an apparatus comprising;

1) a holder for holding said wafer portion;

2) a light source of broadband emission including wavelengths from visible to IR spectrum;

3) a spectrometer configured to operate at light wavelengths in the range between 700 nm and 1000 nm;

4) a lens assembly to collimate light from said light source into a collimated light beam;

5) a microscope objective lens assembly positioned to focus said collimated light beam onto said wafer portion as incident light at a point of incidence, a portion of said incident light being reflected from said wafer portion, said incident light having a beam spot size at said point of incidence, said microscope objective lens-assembly configured to operate in Near InfraRed (NIR) range;

6) means for delivering said light from said light source to said lens assembly to be collimated into said collimated light beam;

7) means for delivering reflected light from said wafer portion to said spectrometer;

8) said lens assembly and said microscope lens assembly configured to provide said beam spot size with a diameter less than 100 microns;

9) an xyz stage assembly, said xyz stage assembly adjustable to provide relative motion between said wafer portion and said microscope lens assembly, to move said point of incidence across said wafer portion, to provide focus adjustment for said objective lens assembly and to provide device navigation; and 10) a computer in communication with said reflectance spectrometer for calculating the remaining thickness of said wafer portion;

directing incoming light from said light source into said lens assembly, said light from said light source having a broad wavelength range;

focusing said light onto said wafer portion at a point of incidence with said microscope lens assembly, a portion of said light being reflected from said wafer portion;

directing reflected light from said wafer portion into said reflectance spectrometer;

measuring the intensity of said reflected light as a function of the wavelength of said reflected light with said reflectance spectrometer to provide intensity vs. wavelength data to said computer; and calculating said remaining substrate thickness at said point of incidence from said intensity vs. wavelength data with said computer.

10. The method of claim 9, wherein said semiconductor wafer is a silicon wafer.

11. A method of measuring the remaining substrate thickness within a FIB milled region of a semiconductor wafer portion comprising the steps of:

providing a wafer portion having a FIB milled region therein, and measuring the remaining substrate thickness within said FIB milled region using the method of claim 9.

12. The method of claim 11, further including the steps of:

mounting said wafer portion in a FIB system having a focused ion beam;

milling a region in said wafer portion with said focused ion beam; and removing said wafer portion from said FIB system for said mounting of said wafer portion into said apparatus.

13. A method of measuring the remaining substrate thickness within a laser milled region of a semiconductor wafer portion comprising the steps of:

providing a wafer portion having a laser milled region therein; and measuring the remaining substrate thickness within said laser milled region using the method of claim 9.

14. The method of claim 13, further including the steps of:

mounting said wafer portion in a laser milling system having a laser;

milling a region in said wafer portion with said laser; and removing said wafer portion from said laser milling system for said mounting of said wafer portion into said apparatus.

15. A method of measuring the remaining substrate thickness within a rotary tool milled region of a semiconductor wafer portion comprising the steps of:

providing a wafer portion having a polished rotary tool milled region therein; and measuring the remaining substrate thickness within said rotary tool milled region using the method of claim 9.

16. The method of claim 15, further including the steps of:

mounting said wafer portion in a rotary tool milling system having a rotary tool;

milling a region in said wafer portion with said rotary tool;

polishing said rotary tool milled region; and before or after said polishing step, removing said wafer portion from said rotary tool milling system for said mounting of said wafer portion into said apparatus.

17. The method of claim 16, wherein said step of mounting said wafer portion in a rotary tool milling system includes mounting said wafer portion on a base and mounting said base in said rotary tool milling system; and wherein said step of removing said wafer portion from said rotary tool milling system includes removing said base with said wafer portion mounted thereon.

18. The method of claim 17, wherein said base is a lapping puck.

19. A method of forming a thickness map of the remaining thickness of a semiconductor wafer portion comprising the steps of:

providing said wafer portion having a mirror polished surface;

providing an optical tool selected from the group consisting of: a reflectance spectrometer, a confocal microscope, and an ellipsometer;

mounting said wafer portion on a viewing stage positioned for measuring said wafer portion by said optical tool;

measuring the thickness of said wafer portion with said optical tool at at least five locations on said wafer portion, a first said location being near the center of said wafer portion, one of the at least four remaining said locations being near each of the four corners of said wafer portion; and determining the thickness difference between said center and each of said at least four remaining locations, and determining thickness uniformity across said wafer portion from these at least five measurements.

20. A method of forming a thickness map of the remaining thickness of a semiconductor wafer portion comprising the steps of:

providing said wafer portion having a mirror polished surface;

providing an optical tool selected from the group consisting of: a reflectance spectrometer, a confocal microscope, and an ellipsometer;

mounting said wafer portion on a viewing stage positioned for measuring said wafer portion by said optical tool;

measuring the thickness of said wafer portion with said optical tool at at least five locations on said wafer portion, a first said location being near the center of said wafer portion, one of the at least four remaining said locations being near each of the four corners of said wafer portion;

determining the thickness difference between said center and each of said at least four remaining locations, and determining thickness uniformity across said wafer portion from these at least five measurements; and calculating the differences in thickness between the smallest measured thickness of said at least five locations on said wafer portion and the thicknesses of each of the at least four remaining locations on said wafer portion, and, based on these calculated thickness differences, determining the amount of wafer thickness which must be removed across the wafer portion to achieve a uniform thickness across said wafer portion.

21. A method of forming a thickness map of the remaining thickness of a semiconductor wafer portion comprising the steps of:

providing said wafer portion having a mirror polished surface;

providing an optical tool selected from the group consisting of: a reflectance spectrometer, a confocal microscope, and an ellipsometer;

mounting said wafer portion on a viewing stage positioned for measuring said wafer portion by said optical tool, wherein said wafer portion is mounted on a lapping puck, said wafer portion and said lapping puck together being mounted on said viewing stage; and measuring the thickness of said wafer portion with said optical tool at at least five locations on said wafer portion, a first said location being near the center of said wafer portion, one of the at least four remaining said locations being near each of the four corners of said wafer portion.

22. The method of claim 21, further including the step of determining if the wafer portion is levelly mounted on said lapping puck.

23. A method for mounting a semiconductor wafer portion having a top surface and a back surface onto a lapping puck to achieve uniform lapping of said top surface by a lapping platen opposing said lapping puck, comprising the steps of:

a) mounting said wafer portion onto said lapping puck by bonding said back surface to said lapping puck;

b) measuring the height of said lapping puck plus said package plus said wafer portion at about the center of said wafer portion and at about the four corners of said wafer portion and determining the height difference between said center and each of said four corners, said height difference being the height at the corner subtracted from the height at the center;

c) determining at which of said four corners said height difference is positive and greater than 10 microns, each of said four corners having a height difference greater than 10 microns being a low corner;

d) removing said mounted wafer portion from said lapping puck;

e) remounting said wafer portion onto said lapping puck with a shim having a height equal to the height difference at a specified low corner positioned between said specified low corner and said lapping puck; and f) repeating steps b)–e) until no low corners remain.

24. The method of claim 23, wherein step b) is performed with a micrometer.

25. A method of providing a uniform thickness to a thinned semiconductor wafer portion comprising the steps of:

a) providing said wafer portion having a mirror polished surface;

b) providing an optical tool selected from the group consisting of: a reflectance spectrometer, a confocal microscope, and an ellipsometer;

c) mounting said wafer portion on a viewing stage positioned for measuring said wafer portion by said optical tool;

d) measuring the thickness of said wafer portion with said optical tool at at least five locations on said wafer portion, a first said location being near the center of said wafer portion, one of the at least four remaining said locations being near each of the four corners of said wafer portion;

e) determining the thickness difference between said center and each of said at least four remaining locations, thereby determining thickness uniformity across said wafer portion and locating local thick regions of said wafer portion;

f) thinning said local thick regions of said wafer portion; and g) repeating steps d)–f) until said wafer portion has substantially uniform thickness.

26. The method of claim 25, wherein said step of thinning said local thick regions of said wafer portion comprises abrading said local thick regions with diamond paste.

27. The method of claim 26, wherein said abrading of said local thick regions with diamond paste is done manually.

* * * * *